United States Patent
Valluri et al.

(12) 
(10) Patent No.: US 6,538,307 B1
(45) Date of Patent: Mar. 25, 2003

(54) PACKAGING SUBSTRATE COMPRISING STAGGERED VIAS

(75) Inventors: Viswanath Valluri, Sunnyvale, CA (US); Edwin Fontecha, San Jose, CA (US); Melissa Siow Lui Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/772,889

(22) Filed: Jan. 31, 2001

Related U.S. Application Data
(60) Provisional application No. 60/214,461, filed on Jun. 28, 2000.

(51) Int. Cl.$^7$ ............................................. H01L 23/495
(52) U.S. Cl. ........................ 257/668; 257/203; 257/676; 257/786
(58) Field of Search ..................... 367/808; 174/52.9; 257/203, 668, 676, 786; 438/33, 113

(56) References Cited

U.S. PATENT DOCUMENTS

| | | | | | |
|---|---|---|---|---|---|
| 5,241,133 | A | * | 8/1993 | Mullen, III et al. | 174/52.4 |
| 5,319,224 | A | * | 6/1994 | Sakashita et al. | 257/203 |
| 5,367,764 | A | * | 11/1994 | DiStefano et al. | 29/830 |
| 5,491,364 | A | * | 2/1996 | Brandenburg et al. | 257/666 |
| 5,532,667 | A | * | 7/1996 | Haertling et al. | 336/177 |
| 5,535,101 | A | * | 7/1996 | Miles et al. | 367/808 |
| 5,583,376 | A | * | 12/1996 | Sickler et al. | 257/702 |
| 5,686,699 | A | * | 11/1997 | Chu et al. | 174/250 |
| 6,150,193 | A | * | 11/2000 | Glenn | 438/112 |

* cited by examiner

*Primary Examiner*—David Nelms
*Assistant Examiner*—Dao H. Nguyen

(57) ABSTRACT

A packaging substrate is formed with staggered vias interconnecting fan-out circuitry for improved strength and rigidity. Embodiments of the present invention include substrates wherein less than 20% of the vias are aligned.

3 Claims, 5 Drawing Sheets

PACKAGING SUBSTRATE COMPRISING STAGGERED VIAS

RELATED APPLICATION

This application claims priority from provisional application Serial No. 60/214,461 filed on Jun. 28, 2000 entitled "PACKINGS SUBSTRATE COMPRISING STAGGERED VIAS", the entire disclosure of which is hereby incorporated by reference herein.

TECHNICAL FIELD

The present invention relates to semiconductor packaging technology. The present invention has particular applicability to semiconductor packages containing a substrate comprising fan-out circuitry electrically interconnected by vias.

BACKGROUND ART

Ongoing advances in solid-state electronic devices impose continuous demands for integrated circuit devices with increased functionality, density, and performance. In response, multi-chip modules have evolved comprising a printed circuit board substrate to which a series of separate components are directly attached. Multi-chip devices advantageously increase circuit density with attendant improvements in signal propagation speed and overall device weight.

Integrated circuit devices are typically electronically packaged by mounting one or more chips to a substrate, e.g., an alumna circuitize substrate or an organic substrate, sometime referred to as a chip carrier. Wire bonds or bumps are employed to electrically connect input/output (IO) contact pads on each chip to corresponding fan-out circuitry on the circuitized chip carrier substrate. The resulting chip carrier is then typically mounted on a printed circuit board (PCB) and, employing circuitry on the PCB, electrically coupled to other such chip carriers and/or other electronic components mounted on the PCB.

Conventional organic circuitized substrates contain two or more layers of fan-out circuitry on two or more organic layers. Such layers of fan-out circuitry are electrically interconnected by mechanically drilled holes known as vias which are plated and/or filled with electrically conductive material, e.g., copper. Some of the holes extend from the layers of fan-out circuitry to respective lands on the chip carrier substrates, on which are mounted solder balls forming a grid array, thereby generating the expression "ball grid array". The solder balls are mechanically and electrically connected to corresponding solderable contact pads on the PCB.

Unfortunately, the mechanically drilled holes or vias electrically interconnecting the layers of fan-out circuitry have very large diameters, requiring the spacing between the fan-out wires to be relatively large, thereby limiting the number of chip I/O pads which can be accommodated by the multilayered substrates. Moreover, conventional practices comprise forming the vias in aligned rows. For example, adverting to FIG. 1, an upper surface of chip carrier substrate 10 comprises two rows of substantially aligned vias, one row of vias substantially aligned with via 11 and another row of vias aligned with via 12. Circuitry lines from such vias are illustrated by reference numeral 13 with respect to vias aligned with via 11 and reference numeral 14 with respect to vias aligned with via 12. The bottom surface of chip carrier substrate 10 is schematically illustrated in FIG. 2 and comprises vias 11 and 12, solder balls 22, and circuitry wiring 23. Such chip carrier substrates have been found to cause failures during various assembling stages, such as die-attaching a semiconductor chip to the upper surface of the substrate and molding to encapsulate the semiconductor die on the substrate with a molding compound.

Accordingly, there exists a need for chip carrier substrates exhibiting high strength and rigidity for use in semiconductor packaging.

SUMMARY OF THE INVENTION

An advantage of the present invention is a chip carrier substrate exhibiting improved strength and rigidity.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a substrate for attaching a semiconductor die to a printed circuit board, the substrate comprising: an upper surface and a lower surface; and vias extending through the substrate between the upper and lower surfaces, wherein the vias are offset from one another such that less than 20% of the vias are aligned.

Embodiments of the present invention comprise substrates having at least 48 vias interconnecting fan-out circuitry. Embodiments of the present invention further include a circuit assembly comprising at least one semiconductor die attached to a printed circuit board by means of a substrate in accordance with the present invention.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawing and description is to be regarded as illustrative in nature, and not as restrictive.

DESCRIPTION OF THE PRESENT INVENTION

Figure 1:
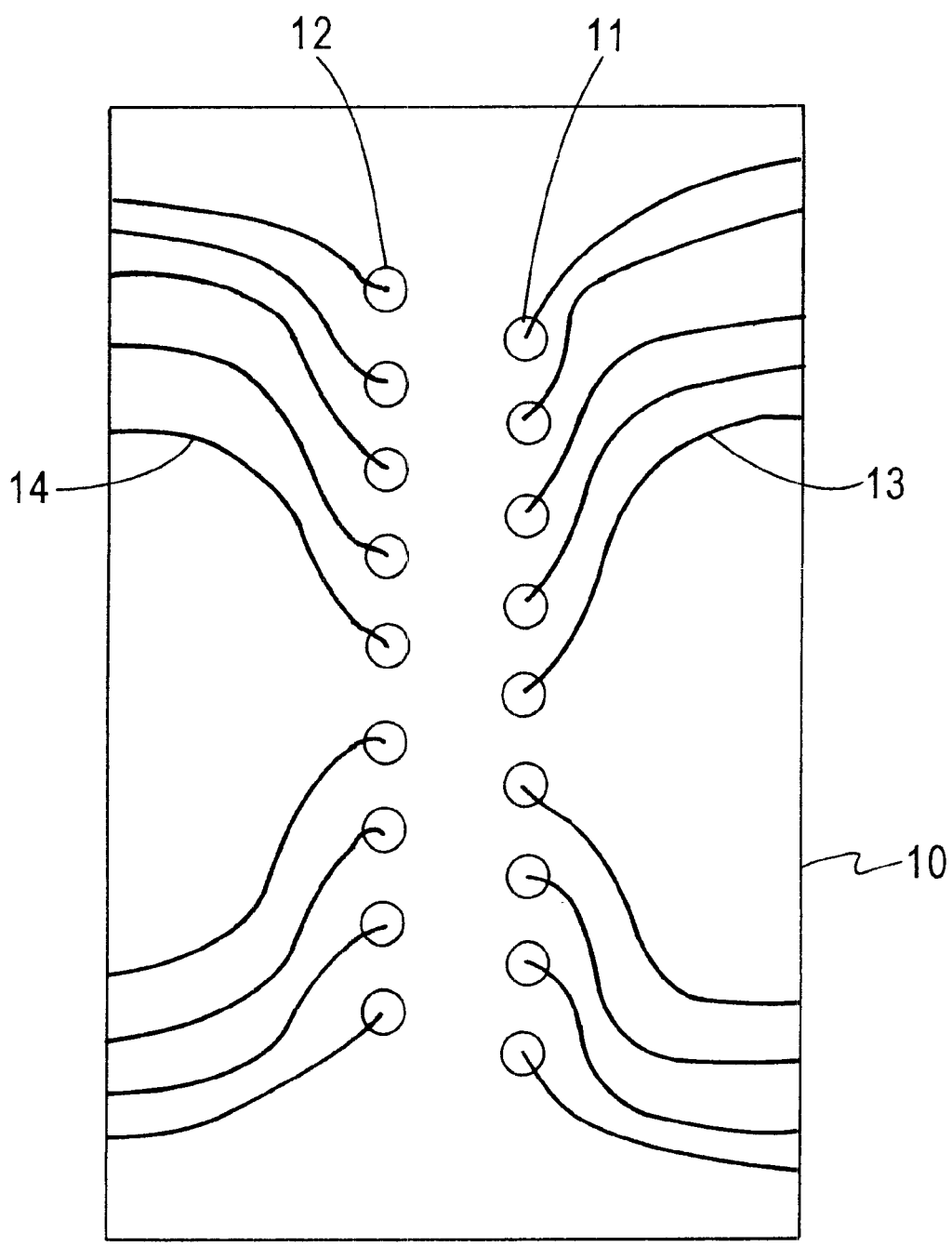
FIG. 1 schematically illustrates, in plan view an upper surface of a conventional chip carrier substrate.
Figure 2:
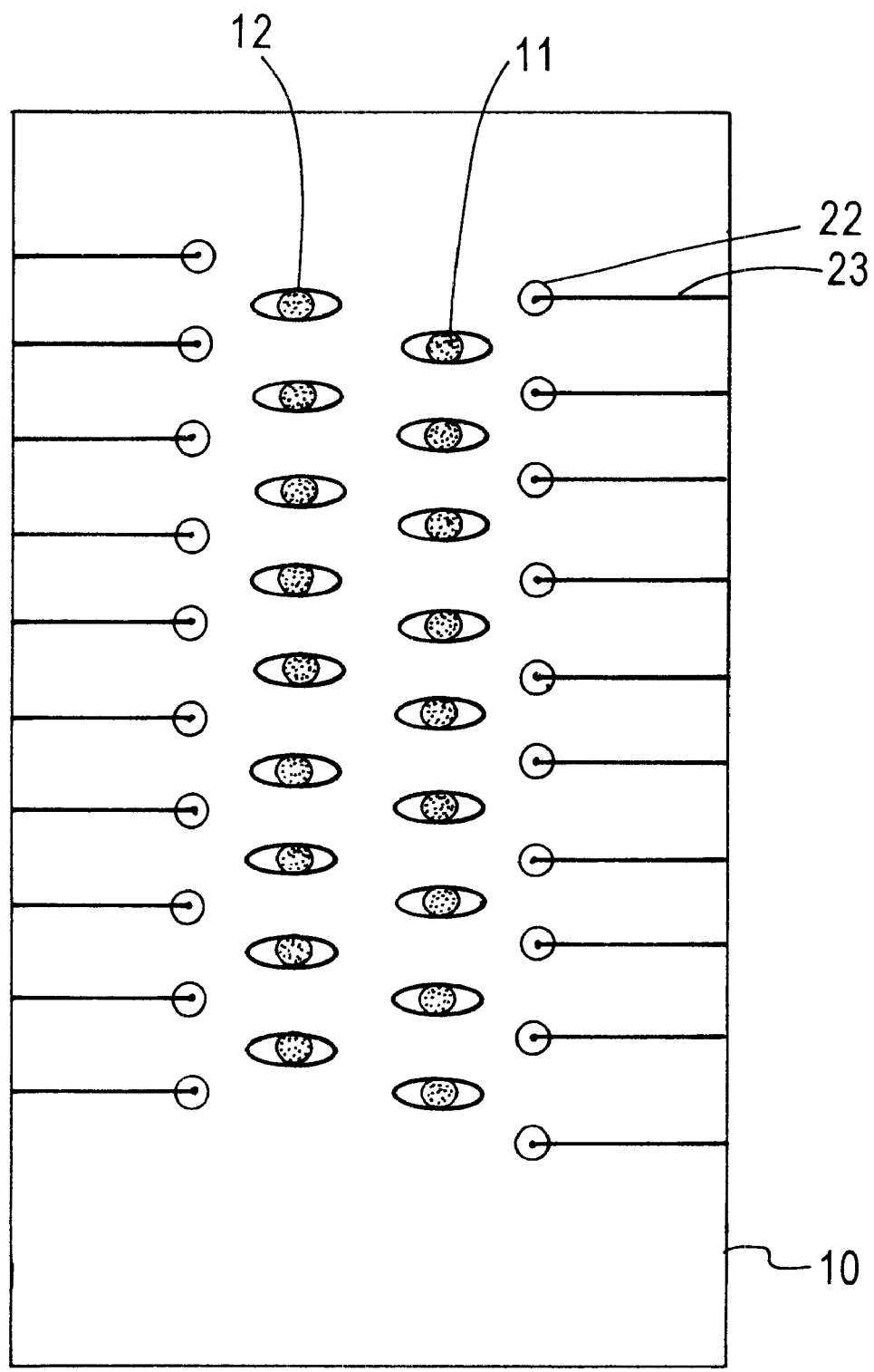
FIG. 2 schematically illustrates, in plan view, a lower surface of a conventional chip carrier substrate.

Upon investigating various failures of chip carrier substrates during die-attaching a semiconductor die thereto and during encapsulation with a molding compound, it was determined that a significant source of such failures stemmed from mechanical weaknesses, such as a reduction in strength and rigidity of the chip carrier substrate because of the mechanically drilled holes or vias extending therethrough. Conventional practices, as shown in FIGS. 1 and 2, comprise forming the vias in aligned rows. It was determined that such alignment of the vias constitutes a significant cause of strength and rigidity problems causing failures during packaging stages.

Having uncovered what is a significant source of the problem, efforts were made to increase the strength of the chip carrier substrates containing vias. In accordance with embodiments of the present invention, this objective is achieved by purposely staggering the vias so that they are not aligned in rows as in conventional practices. The term "aligned" as employed in the specification and claims is intended to denote that a single straight line can be drawn between vias. In accordance with the present invention, the vias are purposely staggered or nonaligned such that less than 20% of the vias are aligned and can be interconnected by a straight line. Thus, in accordance with embodiments of the present invention, in excess of 80% of the vias are staggered or nonaligned.

Embodiments of the present invention comprise chip carrier substrate having conventional fan-out circuitry in upper and lower layers interconnected by the staggered via structure of the present invention. Embodiments of the present invention include fan-out circuitry having at least 48 vias, less than 20% of which are aligned. It was found that purposely staggering the vias such that in excess of 80% of the vias are offset from one another with respect to a straight line significantly improves strength and rigidity, thereby reducing the rejection rate.

Figure 3:
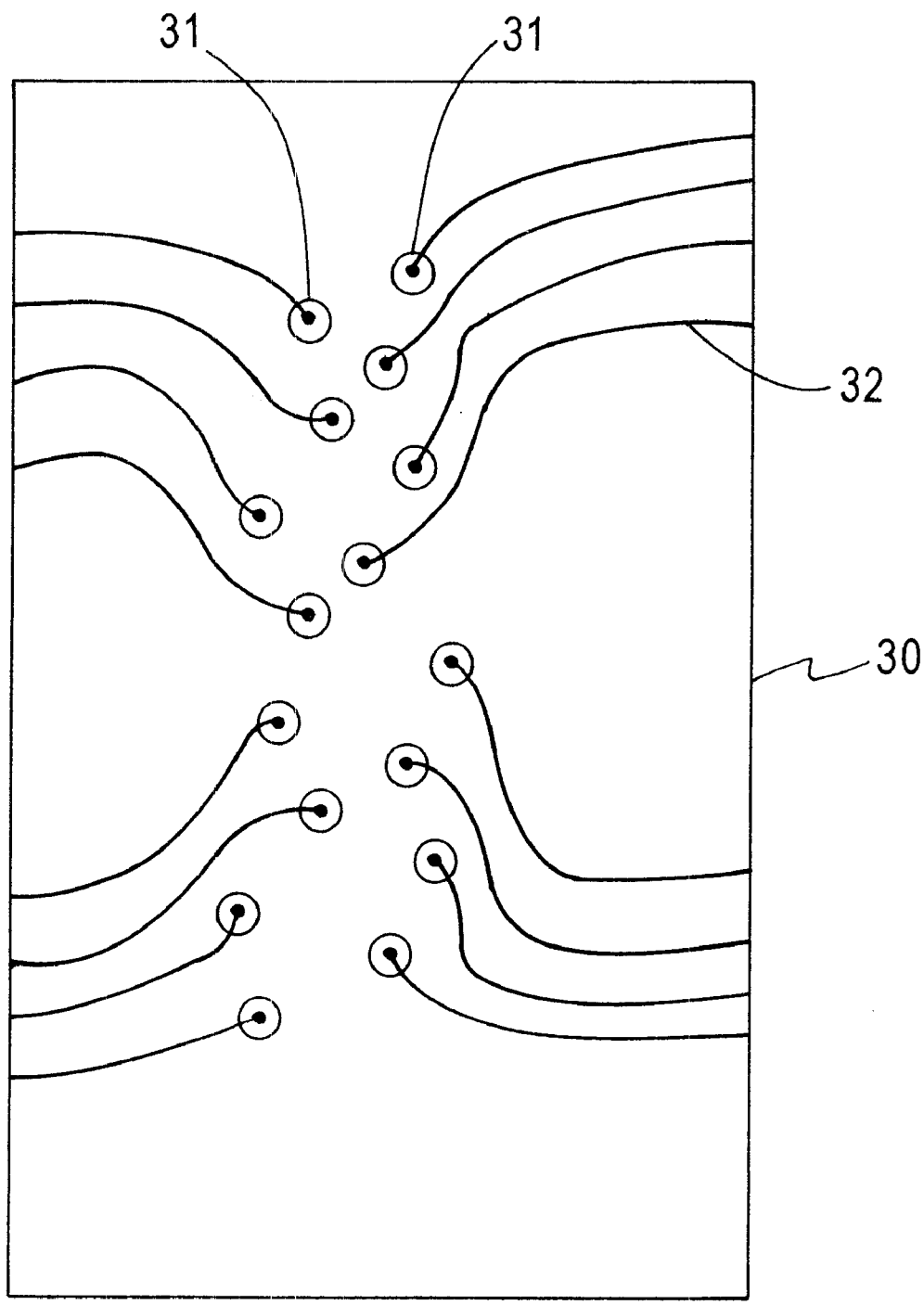
FIG. 3 schematically illustrates, in plan view, an upper surface of a chip carrier substrate in accordance with an embodiment of the present invention.
Figure 4:
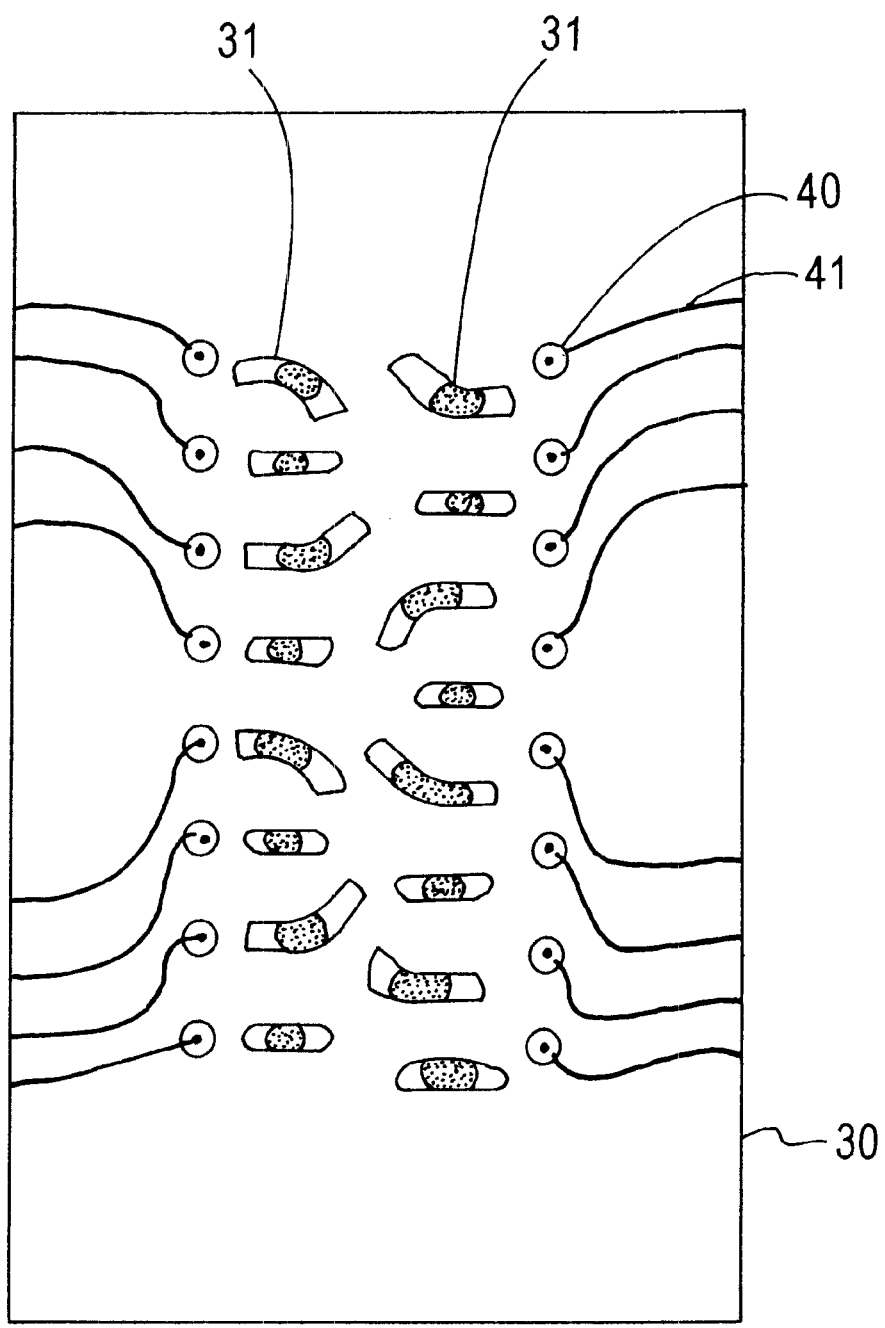
FIG. 4 schematicaly illustrates, in plan view, a lower surface of a chip carrier substrate in accordance with an embodiment of the present invention.

An embodiment of the present invention is schematically illustrated in FIGS. 3 and 4. Adverting to FIG. 3, vias 31 are purposely staggered or nonaligned vis-à-vis the aligned structure shown in FIG. 1. Such staggering of visas 31 provides greater strength and rigidity vis-à-vis the aligned via structure of FIG. 1. Reference numeral 32 denotes fan out circuit lines extending from vias 31. Adverting to FIG. 4, the visas 31 are, similarly, staggered as seen on the bottom surface of chip carrier substrate 30. Also shown in FIG. 4 are solder balls 40 fan out conductive lines 41 extending therefrom.

Figure 5:
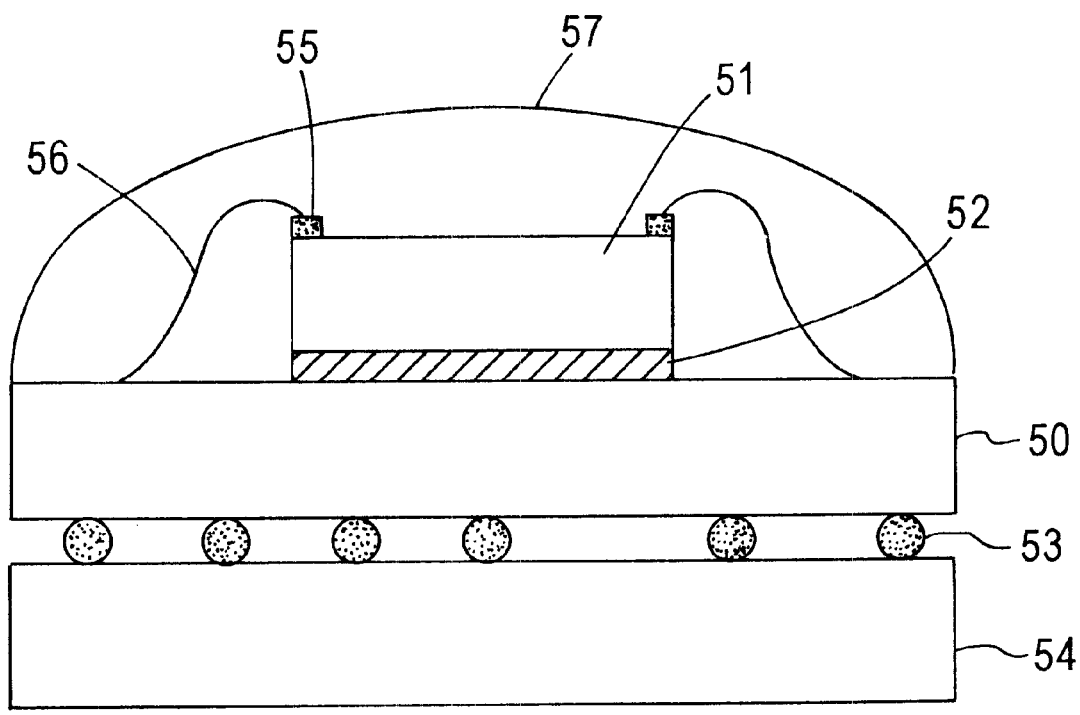
FIG. 5 schematically illustrates a circuit assembly comprising a chip carrier substrate in accordance with an embodiment of the present invention.

The embodiments of the present invention comprising a chip carrier substrate with staggered vias can be employed in fabricating any of various types of semiconductor packages. For example, as shown in FIG. 5, staggered via chip carrier substrate 50 in accordance with an embodiment of the present invention can be employed with a semiconductor die 51 attached thereto with a nonconductive epoxy resin 52. Solder balls 53 are employed to attach chip carrier substrate 50 to a printed circuit board 54. Bond pads 55 are attached to conductors (not shown) on the surface of the carrier substrate 50 by means of bond wires 56. Semiconductor die 51 is encapsulated on substrate 50 by means of molding compound 57.

In accordance with embodiments of the present invention, a chip carrier substrate is provided with vias offset from one another, such that less than 20% of the vias are aligned. Staggering of vias in accordance with embodiments of the present invention improves the strength and rigidity of the substrate vis-à-vis conventional practices wherein the vias are aligned in rows.

The present invention enjoys industrial applicability in manufacturing any of various types of semiconductor packaging wherein semiconductor dies are attached to printed circuit boards by means of a substrate.

Only the preferred embodiment of the present invention and an example of its versatility are shown and described in the present disclosure. It is to be understood that the present invention is capable of use in various other combinations and environments, and is capable of changes or modifications within the scope of the inventive concept as expressed herein.

What is claimed is:

1. A circuit assembly comprising:

a substrate having an upper surface and a lower surface, and vias extending through the substrate between the upper and lower surfaces, wherein the vias are non-aligned from one another such that less than 20% of the vias are aligned;

at least one semiconductor die attached to the upper surface of the substrate;

a printed circuit board attached to the lower surface of the substrate; and bond wires electrically connecting bond pads on the at least one semiconductor die to the substrate.

2. The circuit assembly according to claim 1, where the substrate comprises at least 3 vias.

3. The circuit assembly according to 1, wherein:

the vias electrically connect fan-out circuitry; and the lower surface of the substrate comprises solder balls affixed thereto.

* * * * *